US008415651B2

(12) United States Patent
Lung

(10) Patent No.: US 8,415,651 B2
(45) Date of Patent: Apr. 9, 2013

(54) PHASE CHANGE MEMORY CELL HAVING TOP AND BOTTOM SIDEWALL CONTACTS

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 781 days.

(21) Appl. No.: 12/138,311

(22) Filed: Jun. 12, 2008

(65) Prior Publication Data
US 2009/0309087 A1 Dec. 17, 2009

(51) Int. Cl.
*H01L 47/00* (2006.01)

(52) U.S. Cl.
USPC .... 257/4; 257/2; 257/E27.002; 257/E31.029; 257/E45.002; 257/E47.001; 257/773; 438/95

(58) Field of Classification Search ............. 257/4
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii et al. |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |
| 5,754,472 A | 5/1998 | Sim et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |

(Continued)

FOREIGN PATENT DOCUMENTS

| | | |
|---|---|---|
| WO | WO-0079539 | 12/2000 |
| WO | WO-0145108 | 6/2001 |
| WO | WO-0225733 | 3/2002 |

OTHER PUBLICATIONS

"Magnetic Bit Boost," www.sciencenews.org, Dec. 18 & 25, 2004, p. 389, vol. 166.

(Continued)

*Primary Examiner* — Jerome Jackson, Jr.
(74) *Attorney, Agent, or Firm* — Haynes Beffel & Wolfeld LLP

(57) ABSTRACT

Memory devices and methods for manufacturing are described herein. A memory device as described herein includes a memory element and a first electrode having an inner surface surrounding the memory element to contact the memory element at a first contact surface. The device includes a second electrode spaced away from the first electrode, the second electrode having an inner surface surrounding the memory element to contact the memory element at a second contact surface.

21 Claims, 20 Drawing Sheets

U.S. PATENT DOCUMENTS

| | | |
|---|---|---|
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A * | 11/1999 | Gonzalez et al. ............ 438/128 |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji et al. |
| 6,066,870 A | 5/2000 | Siek |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,797,979 B2 | 9/2004 | Chiang et al. |
| 6,800,504 B2 | 10/2004 | Li et al. |
| 6,805,563 B2 | 10/2004 | Ohashi et al. |
| 6,815,704 B1 | 11/2004 | Chen |
| 6,838,692 B1 | 1/2005 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 * | 8/2005 | Chen ............................ 365/163 |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen et al. |
| 7,009,694 B2 | 3/2006 | Hart et al. |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung et al. |
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,132,675 B2 | 11/2006 | Gilton |
| 7,154,774 B2 | 12/2006 | Bedeschi et al. |
| 7,164,147 B2 | 1/2007 | Lee et al. |
| 7,166,533 B2 | 1/2007 | Happ |
| 7,169,635 B2 | 1/2007 | Kozicki |
| 7,173,271 B2 | 2/2007 | Chang |
| 7,202,493 B2 | 4/2007 | Lung et al. |
| 7,208,751 B2 | 4/2007 | Ooishi et al. |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,254,059 B2 | 8/2007 | Li et al. |
| 7,269,052 B2 | 9/2007 | Segal et al. |
| 7,277,317 B2 | 10/2007 | Le Phan et al. |
| 7,291,556 B2 | 11/2007 | Choi et al. |
| 7,309,630 B2 | 12/2007 | Fan et al. |
| 7,321,130 B2 | 1/2008 | Lung et al. |

| | | |
|---|---|---|
| 7,323,708 B2 | 1/2008 | Lee et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung et al. |
| 7,365,385 B2 | 4/2008 | Abbott |
| 7,379,328 B2 | 5/2008 | Osada et al. |
| 7,385,235 B2 | 6/2008 | Lung et al. |
| 7,394,088 B2 | 7/2008 | Lung |
| 7,394,089 B2 * | 7/2008 | Doyle et al. ............... 257/4 |
| 7,397,060 B2 | 7/2008 | Lung |
| 7,423,300 B2 | 9/2008 | Lung et al. |
| 7,426,134 B2 | 9/2008 | Happ et al. |
| 7,440,308 B2 | 10/2008 | Jeong et al. |
| 7,449,710 B2 | 11/2008 | Lung |
| 2002/0070457 A1 | 6/2002 | Sun et al. |
| 2002/0113273 A1 | 8/2002 | Hwang et al. |
| 2003/0072195 A1 | 4/2003 | Mikolajick |
| 2003/0095426 A1 | 5/2003 | Hush et al. |
| 2003/0186481 A1 | 10/2003 | Lung |
| 2004/0026686 A1 | 2/2004 | Lung |
| 2004/0051094 A1 | 3/2004 | Ooishi |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0062087 A1 | 3/2005 | Chen et al. |
| 2005/0093022 A1 | 5/2005 | Lung |
| 2005/0127347 A1 | 6/2005 | Choi et al. |
| 2005/0127349 A1 | 6/2005 | Horak et al. |
| 2005/0145984 A1 | 7/2005 | Chen et al. |
| 2005/0191804 A1 | 9/2005 | Lai et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2006/0006472 A1 | 1/2006 | Jiang |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157681 A1 | 7/2006 | Chen et al. |
| 2006/0163554 A1 | 7/2006 | Lankhorst et al. |
| 2006/0172067 A1 | 8/2006 | Ovshinsky |
| 2006/0198183 A1 | 9/2006 | Kawahara et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289848 A1 | 12/2006 | Dennison |
| 2007/0008786 A1 | 1/2007 | Scheuerlein |
| 2007/0018219 A1 | 1/2007 | Lim et al. |
| 2007/0030721 A1 | 2/2007 | Segal et al. |
| 2007/0037101 A1 | 2/2007 | Morioka |
| 2007/0045606 A1 | 3/2007 | Magistretti et al. |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0246782 A1 | 10/2007 | Philipp et al. |
| 2007/0249090 A1 | 10/2007 | Philipp et al. |
| 2007/0257300 A1 | 11/2007 | Ho et al. |
| 2007/0262388 A1 | 11/2007 | Ho et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0137400 A1 | 6/2008 | Chen et al. |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Bedeschi, F. et al., "4-MB MOSFET-Selected Phase-Change Memory Experimental Chip," IEEE, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb, " 2005 Symposium on VLSI Technology Digest of Technical Papers, pp. 96-97.

Gibson, G. A. et al., "Phase-change Recording Medium that Enables Ultrahigh-density Electron-beam Data Storage, " Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Gleixner, "Phase Change Memory Reliability", 22nd NVSMW, Aug. 26, 2007, 46 pages.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., "OUM-A 180 nm Nonvolatile Memory Cell Element Technology for Stand Alone and Embedded Applications," IEEE IEDM 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates, " Mat. Res. Soc. Symp. Proc., vol. 106, 1998, pp. 21-26.

* cited by examiner

PHASE CHANGE MEMORY CELL HAVING TOP AND BOTTOM SIDEWALL CONTACTS

PARTIES TO A JOINT RESEARCH AGREEMENT

International Business Machines Corporation, a New York corporation, and Macronix International Corporation, Ltd., a Taiwan corporation, are parties to a Joint Research Agreement.

BACKGROUND OF THE INVENTION

1. Field of the Invention

The present invention relates to high density memory devices based on phase change based memory materials, including chalcogenide based materials and on other programmable resistive materials, and methods for manufacturing such devices.

2. Description of Related Art

Phase change based memory materials, like chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the molten phase change material and allowing at least a portion of the phase change material to stabilize in the amorphous state. It is desirable to minimize the magnitude of the current needed to cause transition of phase change material.

The magnitude of the current needed for reset can be reduced by reducing the size of the phase change material element in the cell and/or the size of electrodes in contact with the phase change material element, so that higher current densities are achieved with small absolute current values through the phase change material.

However, attempts to reduce the size of the phase change material element and/or the electrodes can result in electrical and mechanical reliability issues of the cell because of failures associated with the small contact surface therebetween. These failures include the formation of voids at the interface due to mechanical stress caused by thermal expansion and material density changes during operation.

Additionally, due to variations in manufacturing processes the size of the small contact surface between electrodes and the phase change material will vary from cell to cell in an array. These variations may result in different programming characteristics including wide variations in the resulting resistance of the memory cells.

It is therefore desirable to provide memory cells having a small reset current while also addressing the issues of small contact surfaces between electrodes and phase change material as discussed above. Furthermore, it is desirable provide methods for manufacturing using reliable and repeatable techniques which produce small variations in the contact surfaces across an array of memory cells.

SUMMARY OF THE INVENTION

A memory device as described herein includes a memory element and a first electrode having an inner surface surrounding the memory element to contact the memory element at a first contact surface. The device further includes a second electrode spaced away from the first electrode, the second electrode having an inner surface surrounding the memory element to contact the memory element at a second contact surface.

A method for manufacturing a memory device as described herein includes forming a structure on a top surface of a first conductive element, the structure comprising a first electrode on the first conductive element, a dielectric element on the first electrode, and a second electrode on the dielectric element. A via is formed through the structure, and a memory element is formed within the via.

A memory cell described herein results in the active region within the memory element that can be made extremely small, thus reducing the magnitude of the current needed to induce a phase change. The width (which in some embodiments is a diameter) of the memory element is less than that of the first and second electrodes, the width preferably less than a minimum feature size for a process, typically a lithographic process, used to form the memory cell. The small width concentrates current in the memory element, thereby reducing the magnitude of current needed to induce a phase change in the active region. The first and second electrodes and the dielectric element can be formed using thin film deposition techniques. Furthermore, in operation the active region can be spaced away from the electrodes and the conductive elements, and thus the remaining portions of the memory element can provide some thermal isolation to the active region. Additionally, the dielectric element may comprise material having a low thermal conductivity to also provide some thermal isolation to the active region, which also helps to reduce the amount of current necessary to induce a phase change.

Since the inner surfaces of the first and second electrodes are in contact with an outer surface of the memory element and the first and second conductive elements are in contact with the bottom and top surfaces of the memory element, relatively large contact surfaces are obtained for a small width of the memory element. These relatively large contact surfaces result in improved mechanical and electrical reliability of the cell, and reduce the contact resistance and power consumption of the device.

The first and second electrodes can be formed using thin film deposition techniques, and thus their respective thicknesses can be very well controlled. Additionally, the memory element can be formed by deposition of memory material within a via. The via may be formed by processes which result in very small variations in the sublithographic width of the memory element across an array of memory cells. The tight control in variations in the thicknesses of the first and second electrodes and the width of the memory element result in improved uniformity of the contact areas of memory elements across an array of memory cells, thereby improving the uniformity of operation of the array.

Other aspects and advantages of the present invention can be seen on review of the drawings, the detailed description, and the claims which follow.

DETAILED DESCRIPTION

Figure 1:
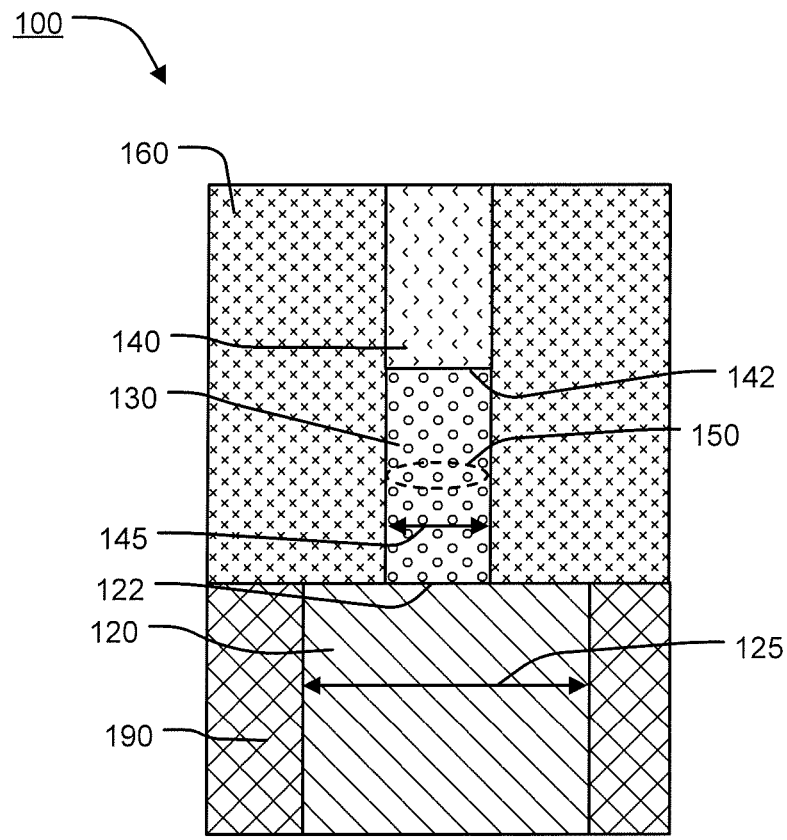
FIG. 1 illustrates a cross-sectional view of a prior art "pillar-type" memory cell.

The following description of the disclosure will typically be with reference to specific structural embodiments and methods. It is to be understood that there is no intention to limit the disclosure to the specifically disclosed embodiments and methods, but that the disclosure may be practiced using other features, elements, methods and embodiments. Preferred embodiments are described to illustrate the present disclosure, not to limit its scope, which is defined by the claims. Those of ordinary skill in the art will recognize a variety of equivalent variations on the description that follows. Like elements in various embodiments are commonly referred to with like reference numerals.

FIG. 1 illustrates a cross-sectional view of a prior art "pillar-type" memory cell 100. The memory cell 100 includes a bottom electrode 120 surrounded by a dielectric 190, a pillar of memory material 130 on the bottom electrode 120, and a top electrode 140 on the pillar of memory material 130. Dielectric 160 surrounds the pillar of memory material 130 and the top electrode 140. The bottom electrode 120 has a width 125 greater than the width 145 of the pillar of memory material 130.

In operation, voltages on the bottom electrode 120 and the top electrode 140 can induce current to flow from the bottom electrode 120 to the top electrode 140, or vice-versa, via the pillar of memory material 130.

Due to the differences in the widths 125 and 145, in operation the current density will be concentrated in the pillar of memory material 130. Thus, the resulting active region 150 can be spaced away from the top and bottom electrodes 140, 120.

It is desirable to minimize the width 145 (which in some examples is a diameter) of the pillar of memory material 130 so that higher current densities are achieved with small absolute current values through the memory material 130.

The pillar of memory material 130 and the top electrode 140 can be formed by sequentially forming a layer of memory material and a layer of top electrode material, and subsequently etching. However, problems have arisen in manufacturing such devices having small widths 145 and aggressive aspect ratios due to issues with undercut etching and/or overetching. This may result in different programming characteristics including the size of the active region 150 across an array, resulting in corresponding variations in the resistance of the memory cells. Furthermore, due to variations in the manufacturing processes used to form the pillar of phase change material 230, the contact surface of interfaces 242, 222 will vary from cell to cell in an array.

Additionally, attempts to reduce the width 145 can result in issues in electrical and mechanical reliability of the interface 122 between the pillar of phase change material 130 and the bottom electrode 120, as well as the reliability of the interface 142 between the pillar of phase change material 130 and the top electrode 140, due to the small contact surfaces therebetween.

Figure 2A:
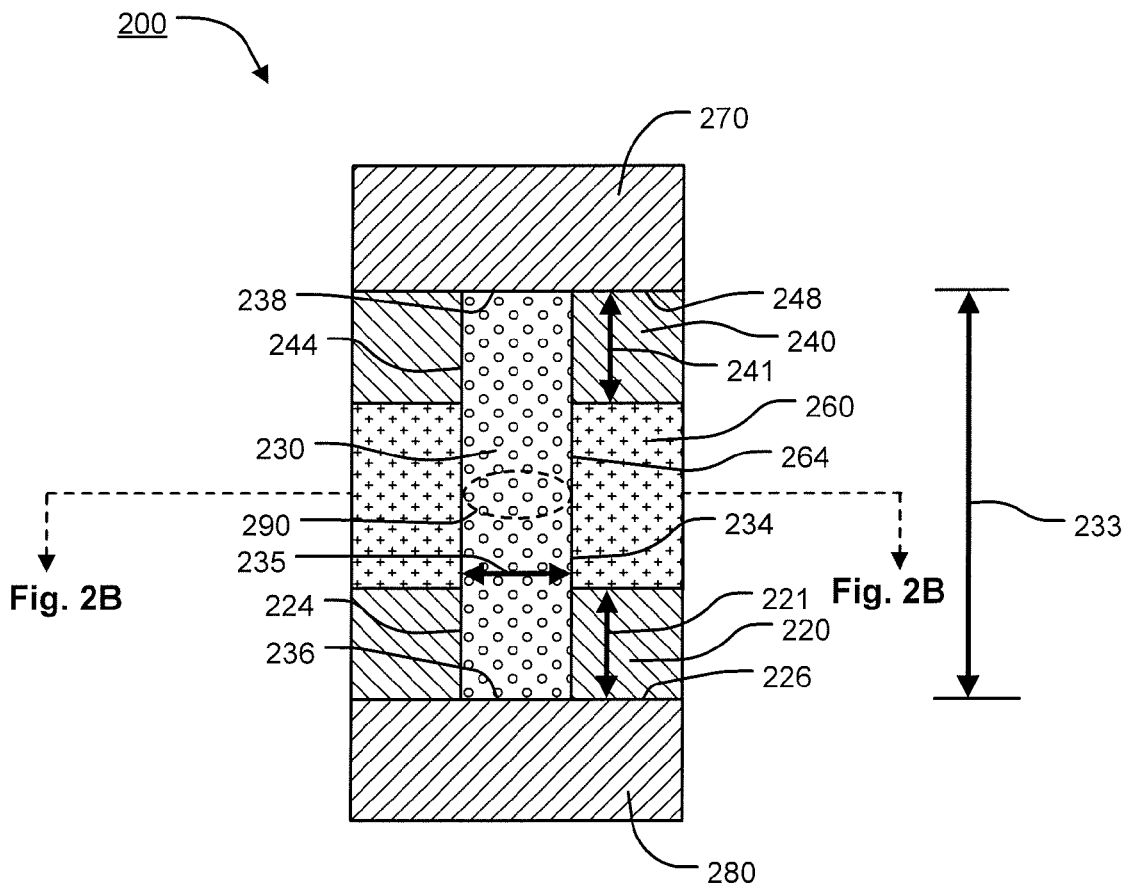
FIGS. 2A-2B illustrate cross-sectional and plan views of a memory cell having relative large contact surfaces, resulting in improved reliability.
Figure 2B:
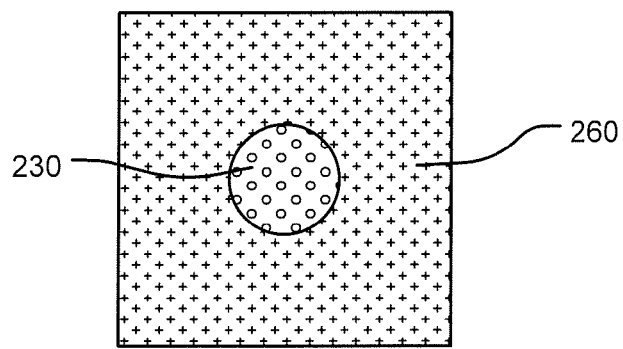

FIG. 2A-2B illustrate a cross-sectional view and a plan view respectively of a first memory cell addressing the issues regarding small contact surfaces discussed above, resulting in improved reliability.

The memory cell 200 includes a first electrode 220 having an inner surface 224, and a second electrode 240 having an inner surface 244. The first and second electrodes 220, 240 may comprise, for example, TiN or TaN. TiN may be preferred in embodiments in which the memory element 230 comprises GST (discussed below) because is makes a good contact with GST, it is a common material used in semiconductor manufacturing, and it provides a good diffusion barrier at the higher temperatures at which GST transitions, typically in the 600-700° C. range. Alternatively, the first and second electrodes 220, 240 may each be W, WN, TiAlN or TaAlN, or comprise, for further examples, one or more elements selected from the group consisting of doped-Si, Si, C, Ge, Cr, Ti, W, Mo, Al, Ta, Cu, Pt, Ir, La, Ni, N, O, and Ru and combinations thereof.

A memory element 230, comprising a pillar of memory material having a cylindrical side surface, contacts the ring-shaped inner surfaces 224, 244 of the first and second electrodes 220, 224 at first and second 20 contact areas respectively, on the cylindrical side surface to electrically couple the first electrode 220 to the second electrode 240 through the pillar of memory material. The memory element 230 may comprise, for example, one or more materials from the group of Zn, To, Tl, Ge, Sb, Te, Se, In, Ti, Ga, Bi, Sn, Cu, Pd, Pb, Ag, S, Si, 0, P, As, N and Au.

A dielectric element 260 comprising one or more layers of dielectric material is between the first and second electrodes 220, 240. The dielectric element 260 has an inner surface 264 contacting the memory element 230 at a third contact surface. The dielectric element 260 may comprise, for example, one or more elements selected from the group consisting of Si, Ti, Al, Ta, N, O, and C, and in the illustrated embodiment comprises SiN. The dielectric element 260 may include voids in some embodiments, resulting in a porous structure which can reduce the thermal conductivity of the element 260.

In the illustrated embodiment the first and second electrodes 240, 220 and the dielectric element 260 form a multilayer stack surrounding the memory element 230, and the respective inner surfaces 224, 244, 264 of the first and second electrodes 220, 240 and the dielectric spacer 260 are aligned to define a via.

The memory element 230 and the bottom electrode 220 have respective bottom surfaces 236 and 226 in contact with a first conductive element 280 to couple the memory cell 200 to underlying access circuitry (not shown). The first conductive element 280 may comprise any of the materials described above with reference to the first and second electrodes 220, 240. Alternatively, the first conductive element 280 may comprise a doped semiconductor material acting as a terminal of an access device such as a transistor or diode, or comprise a conductive plug electrically coupled to a terminal of an access device.

A second conductive element 270 is on top surfaces 238 and 248 of the memory element 230 and second electrode 240 respectively. The second conductive element 270 may comprise a portion of a bit line, for example comprising any of the materials discussed above with reference to the first and second electrodes 220, 240. Alternatively, the second conductive element 270 may be omitted and the top electrode 240 may comprise a portion of a bit line.

In operation, voltages on the first and second conductive elements 280, 270 can induce a current to flow from the first conductive element 280 to the second conductive element 270, or vice versa, via the first electrode 220, the memory element 230, and the second electrode 240.

The active region 290 is the region of the memory element 330 in which the memory material is induced to change between at least two solid phases. As can be appreciated memory element 230 and the active region 290 can be made extremely small in the illustrated structure, thus reducing the magnitude of the current needed to induce a phase change. The width 235 (which in some embodiments is a diameter) of the memory element 230 is less than that of the first and second electrodes 220, 240 and the first and second conductive elements 280, 270, the width 235 preferably less than a minimum feature size for a process, typically a lithographic process, used to form the memory cell 200. The small width 235 concentrates current in the memory element 230, thereby reducing the magnitude of current needed to induce a phase change in the active region 290. The first and second electrodes 220, 240 and the dielectric element 260 can be formed using thin film deposition techniques. Furthermore, in operation the active region 290 can be spaced away from the electrodes 220, 240 and elements 270, 280, and thus the remaining portions of the memory element 230 can provide some thermal isolation to the active region 290. Additionally, the dielectric element 260 may also comprise material having a low thermal conductivity and provide some thermal isolation to the active region 290, which also helps to reduce the amount of current necessary to induce a phase change.

Since the inner surfaces of the first and second electrodes 220, 240 surround and are in contact with an outer surface of the memory element 230 and the first and second conductive elements 280, 270 are in contact with the bottom and top surfaces 236, 238 of the memory element 230, relatively large contact surfaces are obtained for a small width 235 of the memory element 230. These relatively large contact surfaces result in improved mechanical and electrical reliability of the cell 200 for the reasons discussed above, and reduce the contact resistance and power consumption of the device.

The first and second electrodes 220, 240 can be formed using thin film deposition techniques, and thus the respective thicknesses 221 and 241 can be very well controlled. Additionally, the memory element 230 can be formed by CVD deposition of memory material within a via. The via may be formed by processes (discussed in more detail below) which result in very small variations in the sublithographic width 235 of the memory element 230 across an array of memory cells. The tight control in variations in the thicknesses 221, 241 of the first and second electrodes 220, 240 and the width 235 of the memory element 230 result in improved uniformity of the contact areas of memory elements across an array of memory cells, thereby improving the uniformity of operation of the array.

The inner surfaces 224, 244 of the first and second electrodes define openings having a circular cross-section in the illustrated embodiment. However, in embodiments the openings may have a cross-section that is square, elliptical, rectangular, or somewhat irregularly shaped, depending on the manufacturing technique applied to form the inner surfaces 224, 244 of the first and second electrodes 220, 240.

Embodiments of the memory cell 200 include phase change based memory materials, including chalcogenide based materials and other materials, for the memory element 230 respectively. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112 cols. 10-11.) Particular alloys evaluated by another researcher include Ge2Sb2Te5, GeSb2Te4 and GeSb4Te7 (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, $Pr_xSr_yMnO_3$, $ZrO_x$, $WO_x$, $CrO_x$, $TiO_x$, $NiO_x$, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has a bistable or multi-stable resistance state controlled by an electrical pulse.

An exemplary method for forming chalcogenide material uses chemical vapor deposition CVD such as that disclosed in US Publication No 2006/0172067 entitled "Chemical Vapor Deposition of Chalcogenide Materials", which is incorporated by reference herein.

A post-deposition annealing treatment in a vacuum or in an $N_2$ ambient is optionally performed to improve the crystallize state of chalcogenide material. The annealing temperature typically ranges from 100° C. to 400° C. with an anneal time of less than 30 minutes.

Figure 2C:
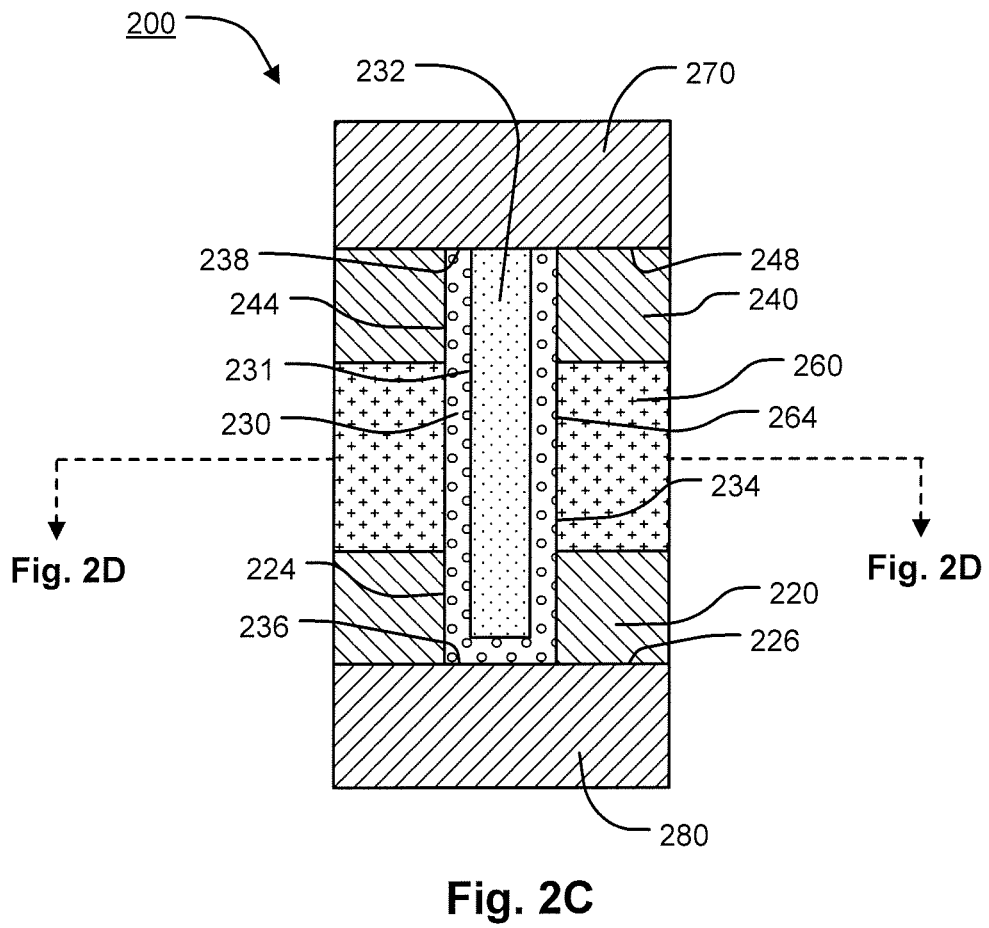
FIGS. 2C-2D illustrate cross-sectional and plan views of a second memory cell with pipe-shaped phase change element, resulting in reduced phase change volume.
Figure 2D:
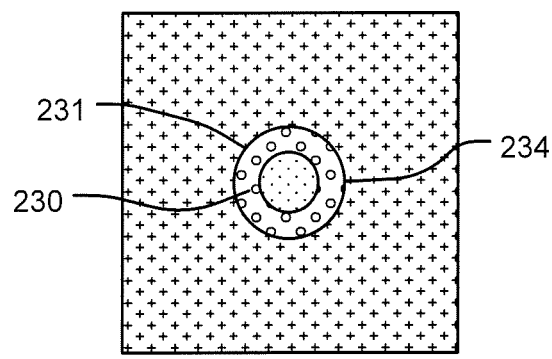

FIGS. 2C-2D illustrate cross-sectional and top views respectively of a second embodiment for memory cell 200 of FIG. 1, with a pipe-shaped phase change element.

In the embodiment illustrated in FIGS. 2C-2D, the memory element 230 has an inner surface 231 defining an interior containing fill material 232. In the illustrated embodiment the fill material 232 is an electrically insulating material and may comprise material having a lower thermal conductivity than the material of the memory element 230. Alternatively, the fill material 232 may comprise an electrically conductive material.

The inner surface 231 and outer surface 234 of the memory element 230 define a ring-shaped top surface 238 of the memory element 230. In the illustrated embodiment the ring-shaped top surface 238 defined by the inner and outer surfaces 231, 234 of the memory element 230 has a circular cross-section. However, in embodiments the ring-shaped top surface 238 may a cross-section that is square, elliptical, rectangular, or somewhat irregularly shaped, depending upon the manufacturing technique used to form the memory element 230. The "ring-shape" of the top surface 238 described herein, is therefore not necessarily circular, but rather takes the shape of the memory element 230.

Figure 3A:
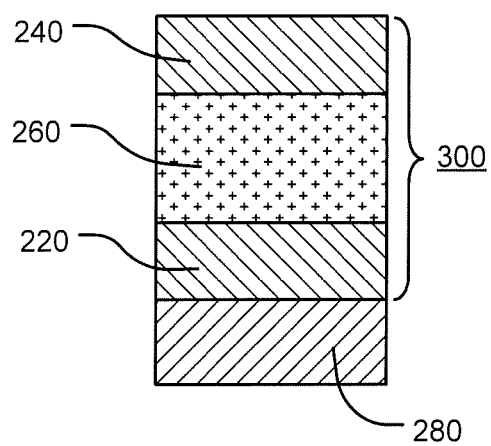
FIGS. 3A-3C illustrate steps in a simplified manufacturing process for manufacturing a memory cell as described herein.
Figure 3B:
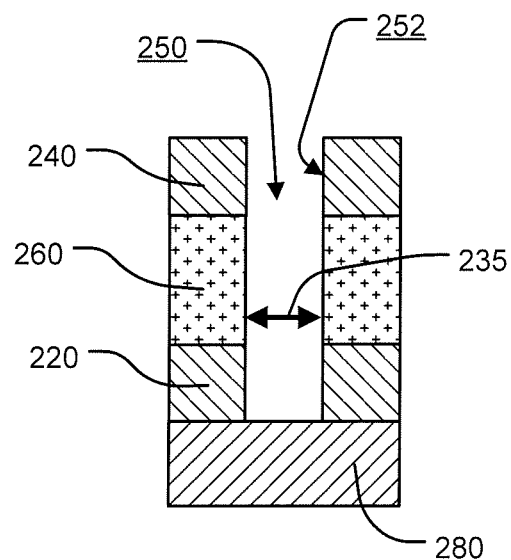
Figure 3C:
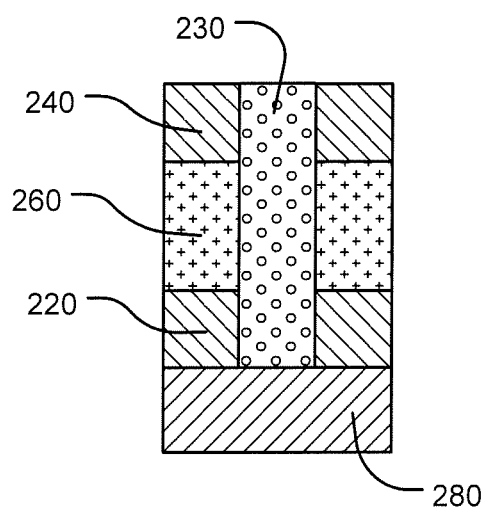

FIG. 3A-3C illustrate steps in a simplified manufacturing process for manufacturing a memory cell as described herein.

FIG. 3A illustrates a cross-sectional view of a first step of forming a structure 300 on first conductive element 280. The structure 300 comprises first electrode 220 on the first conductive element 280, dielectric element 260 on the first electrode 220, and second electrode 240 on the dielectric element 260.

One embodiment for forming the multi-layer structure 300 comprises forming first electrode material on the first conductive element 280, forming dielectric element material on the first electrode material, and forming second electrode material on the dielectric element material. The first and second electrode materials and dielectric material are then patterned to form the structure 300. In such an embodiment the first and second electrodes 220, 240 and the dielectric element 260 define a stack.

Another embodiment for forming the structure 300 comprises forming a first electrode material on the first conductive element 280, and forming a dielectric element material on the first electrode material. The first electrode material and the dielectric material are then patterned to form a stack defined by the first electrode 220 and dielectric element 260. Bit line material is then patterned on the stack to form the second electrode 240, and in such an embodiment the second electrode 240 comprises a portion of a bit line.

Next, via 250 having a sidewall surface 252 is formed through the structure 300 of FIG. 3A, resulting in the structure illustrated in FIG. 3B. The via 250 can be formed by etching using a mask formed on the top electrode 240, the width 335 preferably sublithographic in size. The sidewall surface 252 of the via 250 has a circular cross-section in the illustrated embodiment. However, in embodiments the via 250 may have a cross-section that is square, elliptical, rectangular, or somewhat irregularly shaped, depending on the manufacturing technique applied to form the via 250.

Next, the via 250 of FIG. 3B is filled with memory material to form memory element 230, resulting in the structure illustrated in FIG. 3C. By forming the memory element 230 by depositing memory material within the via 250 and performing a planarization process such as CMP, problems of etching phase change material including problems of etch damage and overetching are avoided.

In some embodiments the second conductive element 270 is then formed on the structure illustrated in FIG. 3C, resulting in the memory cell as illustrated in FIGS. 2A-2B.

Figure 3D:
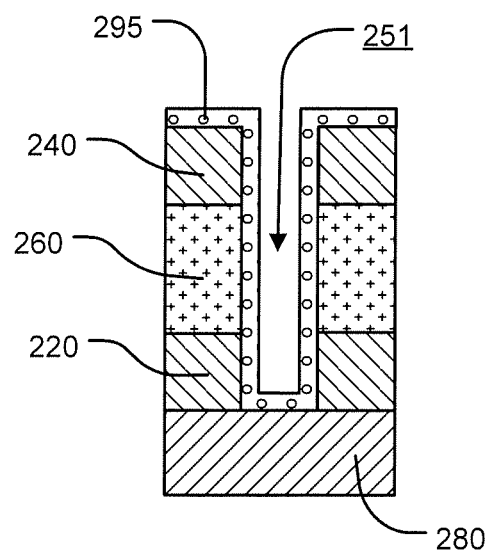
FIGS. 3D-3E illustrate steps in a simplified manufacturing process for forming the memory element within the via.
Figure 3E:
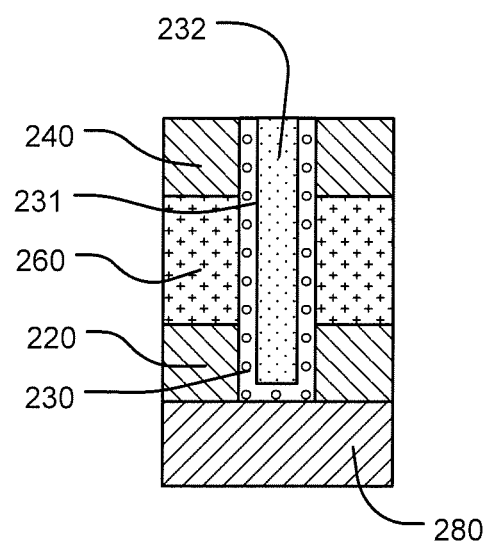

FIGS. 3D-3E illustrate a second manufacturing process for forming the memory element 230 within the via 250. In FIG. 3D, memory material 295 is deposited on the structure illustrated in FIG. 3B including within the via 250 to define an interior 251 within the via 250. In the illustrated embodiment the layer of memory material 295 is formed by Chemical Vapor Deposition.

Next, a dielectric fill material is formed on the structure illustrated in FIG. 3D to fill the interior 251, and a planarization process is performed, resulting in the structure illustrated FIG. 3E having dielectric fill material 232 within an interior defined by the inner surface 231 of the memory element 230. In some embodiments the second conductive element 270 is then formed on the structure illustrated in FIG. 3E, resulting in the memory cell as illustrated in FIGS. 2C-2D.

In one process for forming the via 250 through the first and second electrodes 220, 240 and the dielectric element 260, an isolation layer is formed on the top surface of the stack 300 of FIG. 3A and a sacrificial layer is formed on the isolation layer. Next, a mask having an opening close to or equal to the minimum feature size of the process used to create the mask is formed on the sacrificial layer, the opening overlying the stack 300. The sacrificial layer and the isolation layer are then etched to form an opening in the sacrificial layer and the isolation layer and expose the top surface of the stack 300. After removal of the mask, a selective undercutting etch is performed on the opening such that the isolation layer is etched while leaving the sacrificial layer and the stack 300 intact. A fill material in then formed in the opening, which due to the selective undercutting etch process results in a self-aligned void in the fill material being formed within the opening. Next, an anisotropic etching process is performed on the fill material to open the void, and etching continues until a portion of the top surface of the stack 300 is exposed in the region below the void, thereby forming a sidewall spacer comprising fill material within the opening. The sidewall spacer has an opening dimension substantially determined by the dimension of the void, and thus can be less than the minimum feature size of a lithographic process. Next, the stack 300 is etched using the sidewall spacer as an etch mask, thereby forming via 250 in the having a width or diameter 235 less than the minimum feature size. Memory material is then formed within the via, and a planarizing process removes the sidewall spacer and sacrificial layer resulting in the structure illustrated in FIG. 3C.

Figure 4:
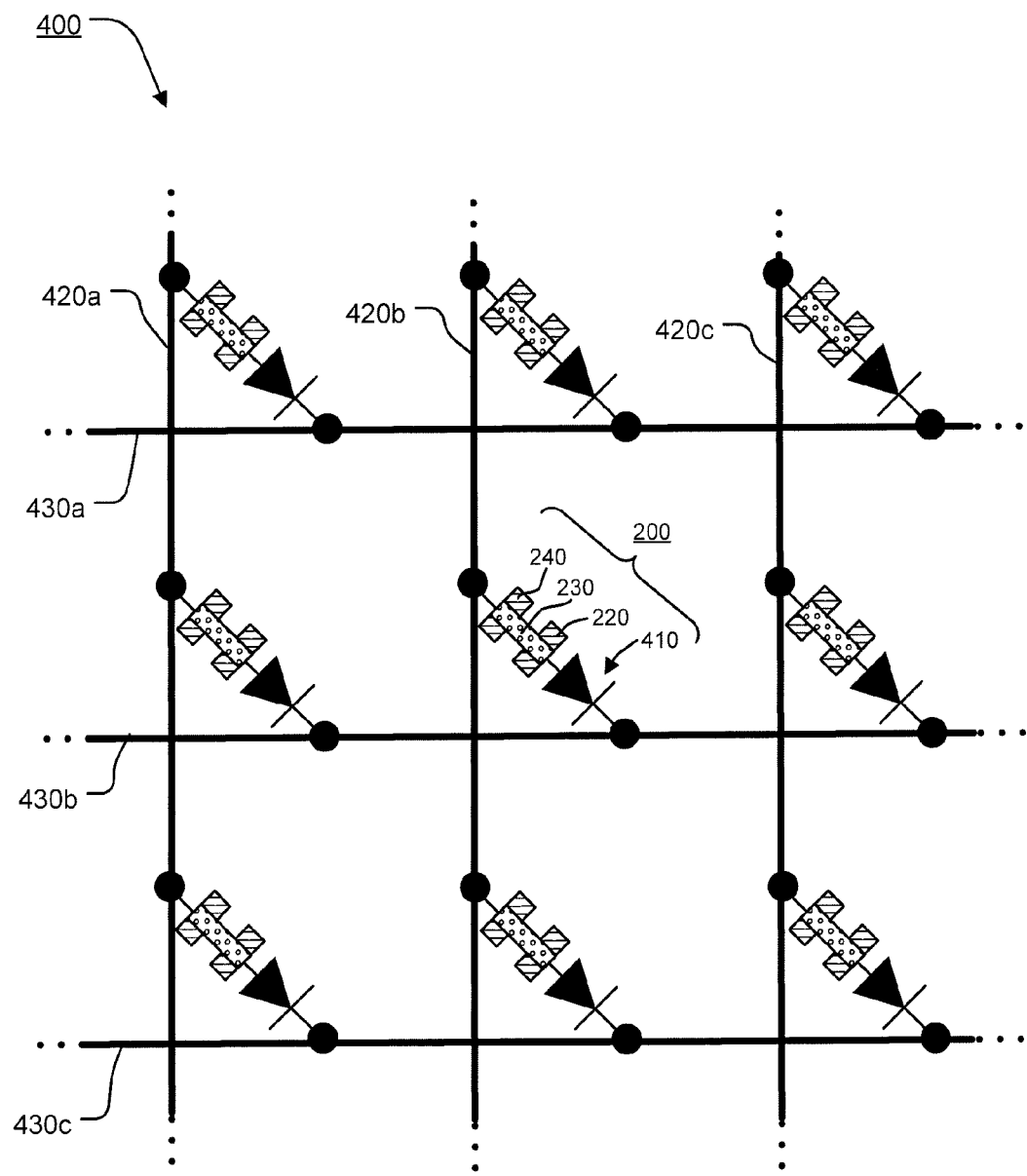
FIG. 4 illustrates a schematic diagram of a portion of a cross-point memory array implemented using memory cells having memory elements contacting inner surfaces of first and second electrodes as described herein.

FIG. 4 illustrates a schematic diagram of a portion of a cross-point memory array 400 implemented using memory cells having memory elements contacting inner surfaces of first and second electrodes as described herein.

As shown in the schematic diagram of FIG. 4, each of the memory cells of array 400 includes a diode access device and a memory element capable of being set to one of a plurality of resistive states and thus capable of storing one or more bits of data.

The array 400 includes a plurality of word lines 430 including word lines 430a, 430b, and 430c extending in parallel in a first direction, and a plurality of bit lines 420 including bit lines 420a, 420b, and 420c extending in parallel in a second direction perpendicular to the first direction. The array 400 is referred to as a cross-point array because the word lines 430 and bit lines 420 are arranged in such a manner that a given word line 430 and a given bit line 420 cross over each other but do not physically intersect, and the memory cells are located at these cross-point locations of the word lines 430 and bit lines 420.

Memory cell 200 is representative of the memory cells of array 400 and is arranged at the cross-point location of the bit line 420b and word line 430b, the memory cell 200 comprising a diode 410 and memory element 230 arranged in series.

Reading or writing to memory cell 200 can be achieved by applying appropriate voltages and/or currents to the corresponding word line 430b and bit line 420b to induce a current through a selected memory cell 200. The level and duration of the voltages/current applied is dependent upon the operation performed, e.g. a reading operation or a writing operation.

In a reset (or erase) operation of memory cell 200 having memory element 230, a reset pulse is applied to the corresponding word line 430b and bit line 420b to cause a transition of an active region of the memory element 230 into an amorphous phase, thereby setting the phase change material to a resistance within a resistive value range associated with the reset state. The reset pulse is a relatively high energy pulse, sufficient to raise the temperature of at least the active region of the memory element 230 above the transition (crystallization) temperature of the phase change material and also above the melting temperature to place at least the active region in a liquid state. The reset pulse is then quickly terminated, resulting in a relatively quick quenching time as the active region quickly cools to below the transition temperature so that the active region stabilizes to an amorphous phase.

In a set (or program) operation of memory cell 200, a program pulse is applied to the corresponding word line 430b and bit line 420b of suitable amplitude and duration to induce a current sufficient to raise the temperature of at least a portion of the active region above the transition temperature and cause a transition of a portion of the active region from the amorphous phase into a crystalline phase, this transition lowering the resistance of the memory element 230 and setting the memory cell 200 to the desired state.

In a read (or sense) operation of the data value stored in memory cell 200, a read pulse is applied to the corresponding word line 430b and bit line 420b of suitable amplitude and duration to induce current to flow that does not result in the memory element 230 undergoing a change in resistive state. The current through the memory cell 200 is dependent upon the resistance of the memory element 230 and thus the data value stored in the memory cell 200.

Figure 5A:
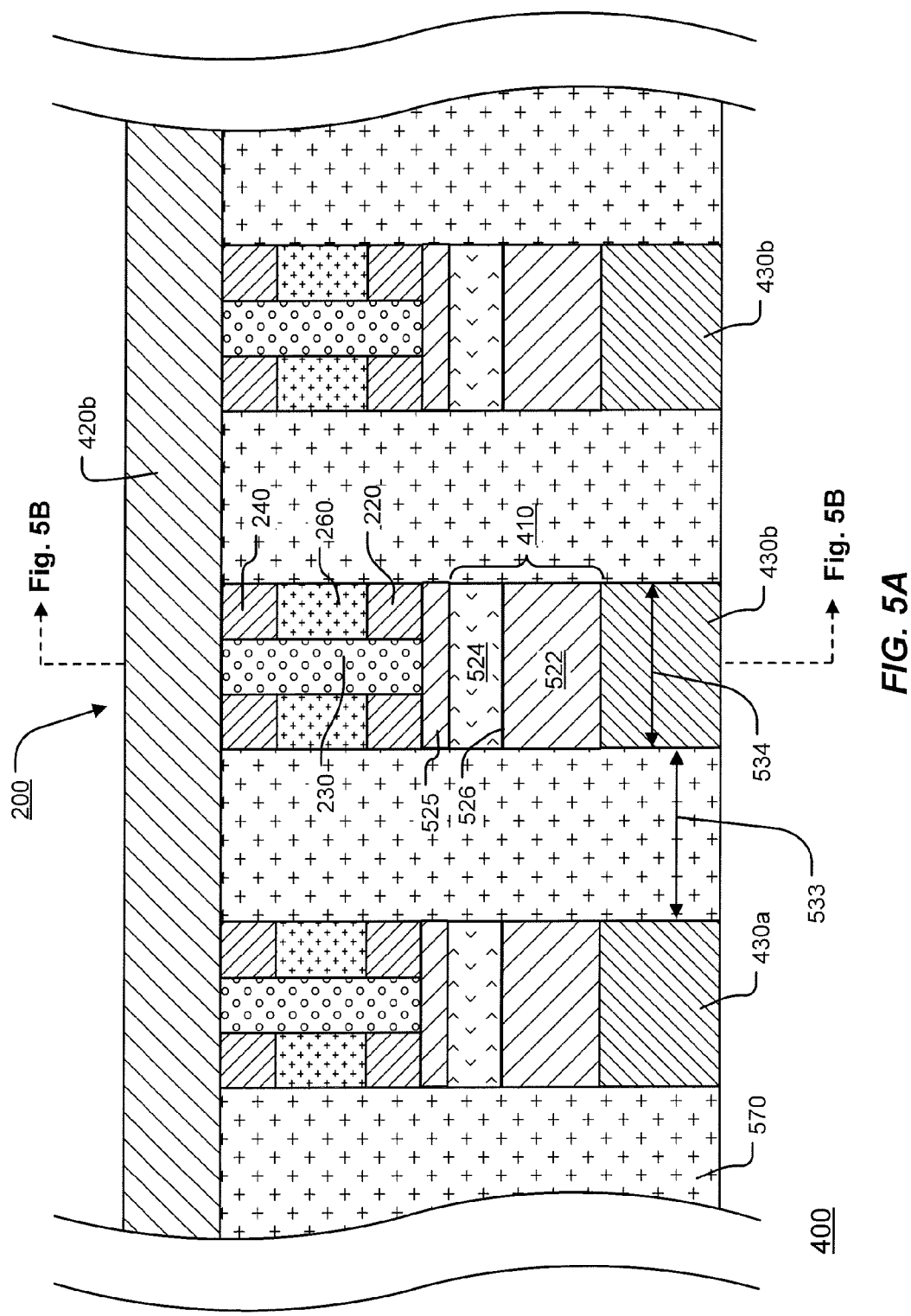
FIGS. 5A-5B illustrate cross-sectional views of a portion of memory cells arranged in the cross-point array.
Figure 5B:
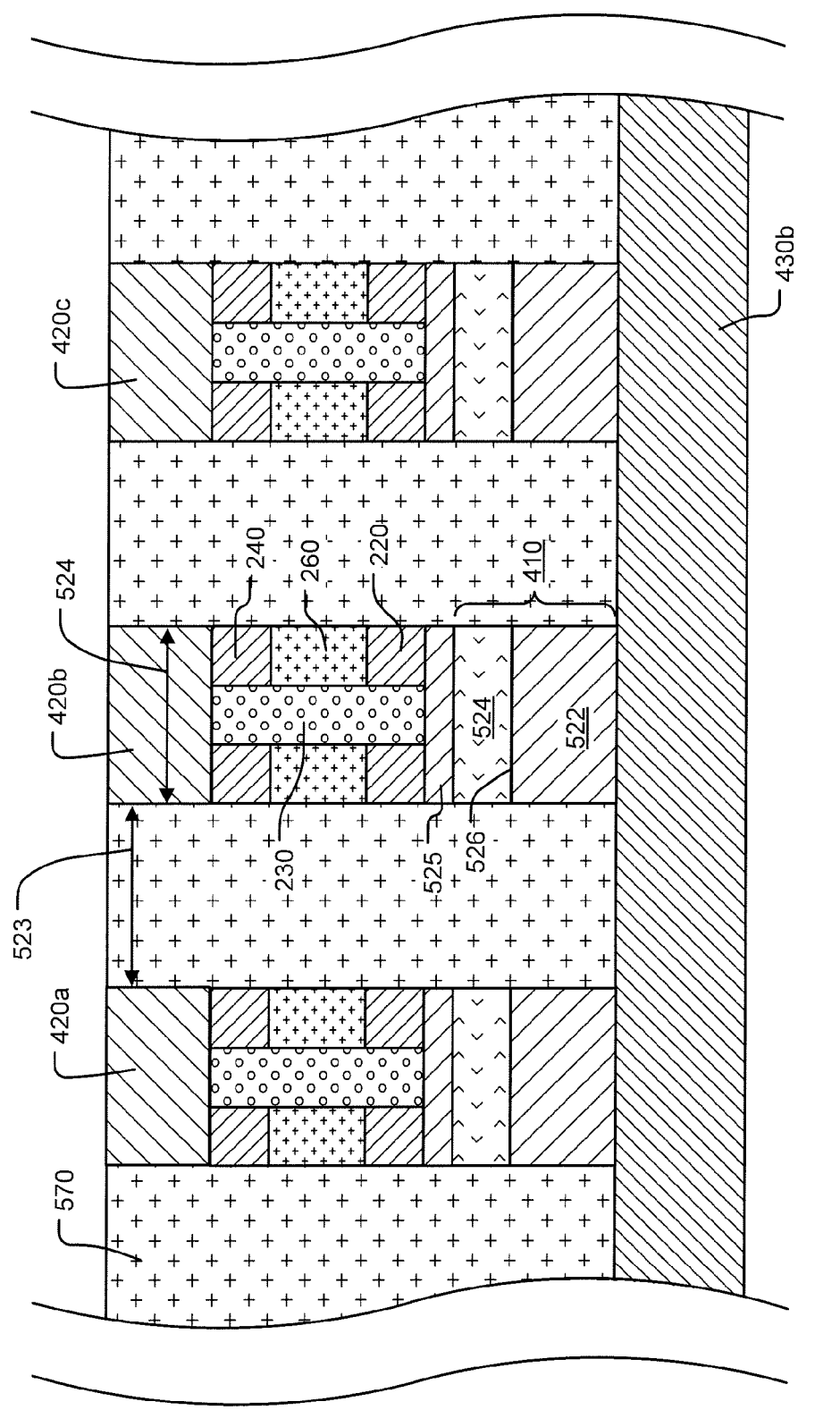

FIGS. 5A and 5B illustrate cross-sectional views of a portion of memory cells (including representative memory cell 200) arranged in the cross-point array 400, FIG. 5A taken along the bit lines 420 and FIG. 5B taken along the word lines 430. Dielectric 570, comprising one or more layers of dielectric material, surrounds the memory cells and separates adjacent word lines 430 and adjacent bit lines 420.

Referring to FIGS. 5A and 5B, the memory cell 200 includes a first doped semiconductor region 522 having a first conductivity type and a second doped semiconductor region 524 on the first doped semiconductor region 522, the second doped semiconductor region 524 having a second conductivity type opposite the first conductivity type. The first doped semiconductor region 522 and the second doped semiconductor region 524 define a pn junction 526 therebetween to define diode 410. A conductive cap 525 comprising, for example, W, TiN, or a silicide is on the second doped semiconductor region 524 to provide a good ohmic contact between the diode 410 and the memory element 230.

The first doped semiconductor region 522 is on word line 430b, the word line 430b extending into and out of the cross-section illustrated in FIG. 5A. In the illustrated embodiment the word lines 430 comprise doped N+ (highly doped N-type) semiconductor material, the first doped semiconductor region 522 comprises doped N− (lightly doped N-type) semiconductor material, and the second doped semiconductor region 524 comprises doped P+ (highly doped P-type) semiconductor material. In an alternative embodiment the region 522 may comprise undoped semiconductor material.

The first and second doped regions 522, 524 of the diode 410 and the word lines 430 can be formed in a single-crystalline semiconductor or polycrystalline semiconductor. For example, the first and second doped regions 522, 524 may comprise polysilicon and the word lines 430 may comprise single-crystalline silicon or a metal.

As can be seen in the cross-sections illustrated in FIGS. 5A and 5B, the memory cells of the array 400 are arranged at the cross-point locations of the bit lines 420 and word lines 430. Memory cell 200 is representative and is arranged at the cross-point location of bit line 420b and word line 430b. Additionally, the diode 410, the first and second electrodes 220, 240, and dielectric element 260 have a first width substantially the same as the width 534 of the word lines 430 (See FIG. 5A). Furthermore, the diode 410, the first and second electrodes 220, 240, and the dielectric element 260 have a second width substantially the same as the width 524 of the word lines 420 (See FIG. 5B). Therefore, the cross-sectional area of the memory cells of array 400 is determined entirely by dimensions of the word lines 430 and bit lines 420, allowing for a high density for array 400.

The word lines 430 have word line widths 534 and adjacent word lines 430 are separated by a word line separation distance 533 (See FIG. 5A), and the bit lines 420 have bit line widths 524 and adjacent bit lines 420 are separated by a bit line separation distance 523 (See FIG. 5B). In preferred embodiments the summation of the word line width 534 and the word line separation distance 533 is equal to twice a feature size F of a process used to form the array 400, and the summation of the bit line width 524 and the bit line separation distance 523 is equal to twice the feature size F. Additionally, F is preferably a minimum feature size for a process (typically a lithographic process) used to form the bit lines 420 and word lines 430, such that the memory cells of array 400 have a memory cell area of 4 $F^2$.

Figure 6:
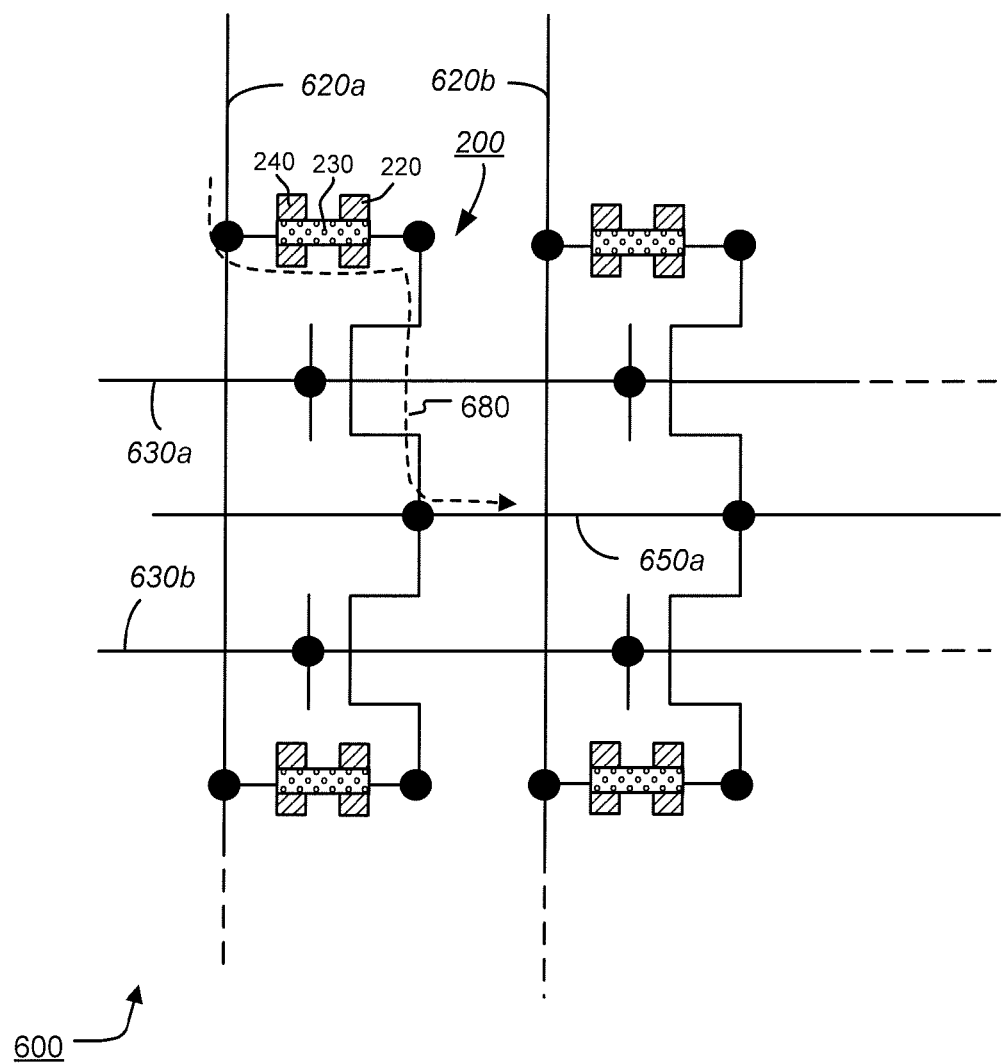
FIG. 6 illustrates a schematic diagram of a portion of a memory cell array implemented using memory cells having memory elements contacting inner surfaces of first and second electrodes as described herein.

FIG. 6 illustrates a schematic diagram of a portion of a memory cell array 600 implemented using memory cells having memory elements contacting inner surfaces of first and second electrodes as described herein.

As shown in FIG. 6, each of the memory cells of array 600 includes an access transistor and memory element. In FIG. 6, four memory cells having respective memory elements are illustrated, representing a small section of an array that can include millions of memory cells.

The array 600 includes a plurality of word lines 630 including word lines 630a, 630b extending in parallel in a first direction, and a plurality of bit lines 620 including bit lines 620a, 620b extending in parallel in a second direction perpendicular to the first direction.

Sources of each of the four access transistors illustrated are connected in common to source line 650a that terminates in a source line termination circuit, such as a ground terminal. In another embodiment the source lines of the access devices are not electrically connected, but independently controllable. The source line termination circuit may include bias circuits such as voltage sources and current sources, and decoding circuits for applying bias arrangements, other than ground, to the source line 650a in some embodiments.

Memory cell 200 is representative of the memory cells of array 600. Word line 630a is coupled to the gate of the access transistor of memory cell 200, and the memory element 230 and first and second electrodes 220, 240 are arranged between the drain of the access transistor and the bit line 620a. Alternatively, the memory element 230 and the electrodes 220, 240 may be on the source side of the access transistor.

Reading or writing to memory cell 200 can be achieved by applying appropriate voltages and/or currents to the word line 630a, bit line 620a, and source line 650a to turn on the access transistor of memory cell 200 and induce current in path 680 to flow from the bit line 620a to the source line 650a, or vice versa. The level and duration of the voltages and/or current applied is dependent upon the operation performed, e.g. a reading operation or a writing operation.

In a reset (or erase) operation of the memory cell 200, a reset pulse is applied to the word line 630a and bit line 620a of suitable amplitude and duration to induce a current to flow through the memory element 230, the current raising the temperature of an active region of the memory element 230 above the transition temperature of the phase change material and also above the melting temperature to place the active region in a liquid state. The current in then terminated, for example by terminating the voltage pulses on the bit line 620a and on the word line 630a, resulting in a relatively quick quenching time as the active region rapidly cools to stabilize to a high resistance generally amorphous phase. The reset operation can also comprise more than one pulse, for example using a pair of pulses.

In a set (or program) operation of memory cell 200, a program pulse is applied to the word line 630b and bit line 620b of suitable amplitude and duration to induce a current sufficient to raise the temperature of at least a portion of the active region above the transition temperature and cause a transition of a portion of the active region from the amorphous phase into a crystalline phase, this transition lowering the resistance of the memory element 230 and setting the memory cell 200 to the desired state.

In a read (or sense) operation of the data value stored in memory cell 200, a read pulse is applied to the corresponding word line 630b and bit line 620b of suitable amplitude and duration to induce current to flow that does not result in the memory element 230 undergoing a change in resistive state. The current through the memory cell 200 is dependent upon the resistance of the memory element 230 and thus the data value stored in the memory cell 200.

It will be understood that the memory array 600 is not limited to the array configuration illustrated in FIG. 6, and additional array configurations can also be used. Additionally, instead of MOS transistors bipolar transistors may be used as access devices in some embodiments.

Figure 7:
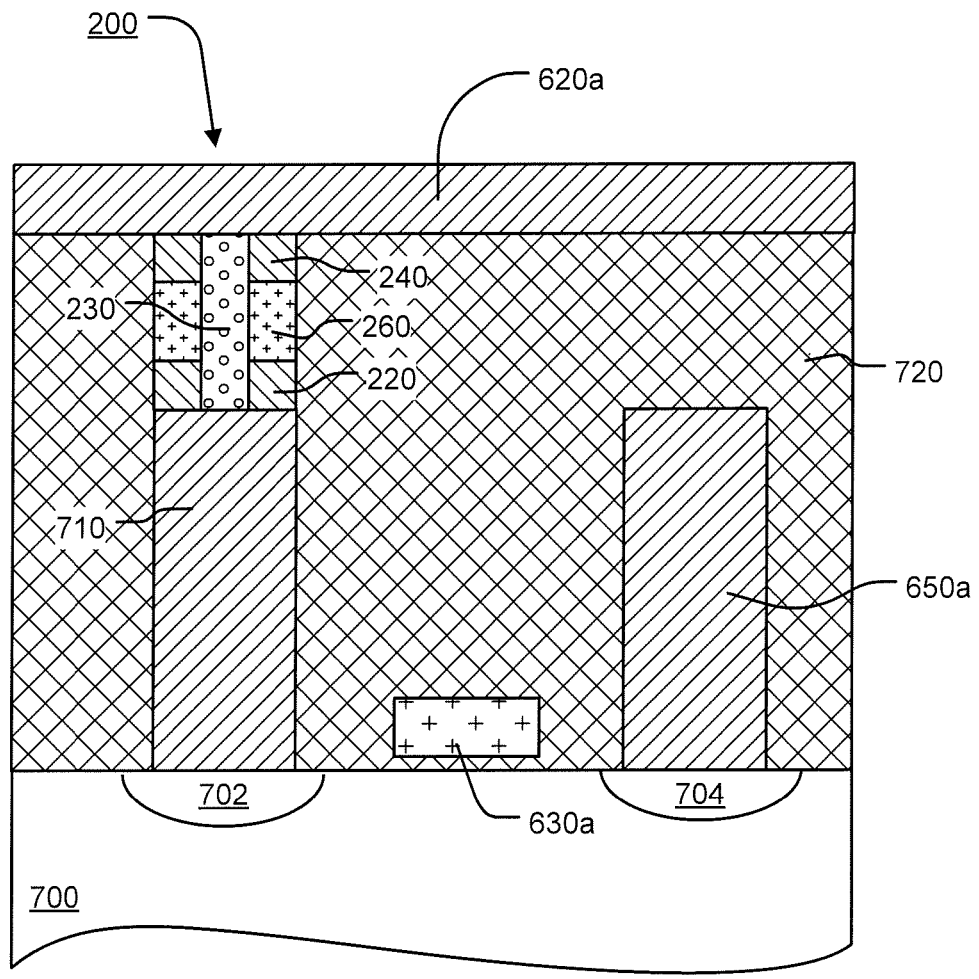
FIG. 7 illustrates a cross-sectional view of a portion of the array of FIG. 6.

FIG. 7 illustrates a cross-sectional view of a portion of array 600 (including representative memory cell 200). Word line 630a extends into and out of the cross-section illustrated in FIG. 7, the word line 630a overlying a substrate 700 to form the gate of the access transistor of memory cell 200.

The source line 650a contacts doped region 704 acting as the source region of the access transistor, and a conductive plug 710 contacts doped region 702 acting as the drain region of the access transistor. In other embodiments the source line 650a may be implemented by a doped region in the substrate 700.

Dielectric 720 comprising one or more dielectric layers overly the substrate 700. Bit line 620a is on the dielectric 720 and electrically coupled to the conductive plug 710 via the memory element 230 and first and second electrodes 220, 240.

FIGS. 8-17 illustrate steps in a manufacturing process resulting in the memory cells as illustrated in FIG. 7.

Figure 8:
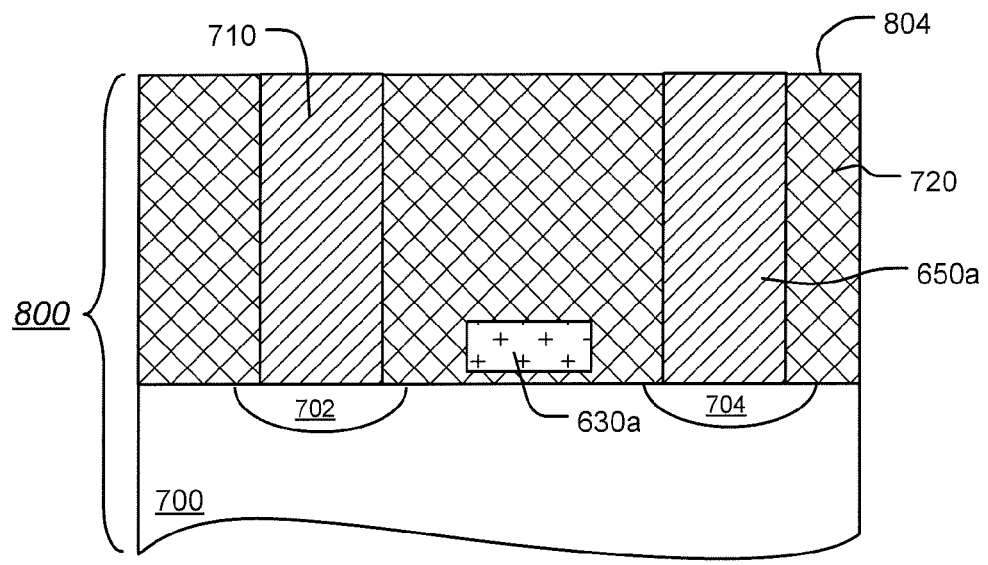
FIGS. 8-17 illustrate steps in a manufacturing process resulting in the memory cells as illustrated in FIG. 7.

FIG. 8 illustrates a cross-sectional view of a first step of providing memory access layer 800 having a top surface 804, the plug 710 extending through dielectric 720 to the top surface 804. The memory access layer 800 can be formed by standard processes as known in the art and includes word lines 630 extending in a direction into and out of the cross-section illustrated in FIG. 8.

Figure 9:
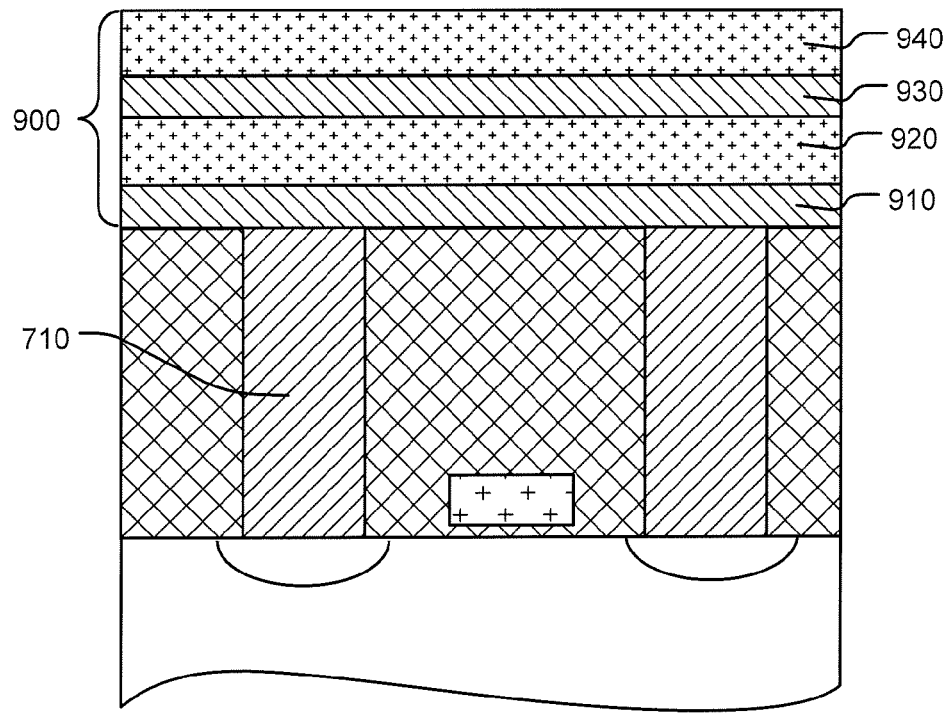

Next, a structure 900 is formed on the top surface 804 of the memory access layer 800 of FIG. 8, resulting in the structure illustrated in FIG. 9. The structure 900 includes first electrode material 910 formed on the top surface 804 of the memory access layer 800, dielectric element material 920 formed on the first electrode material 910, second electrode material 930 formed on the dielectric element material 920, and sacrificial material 940 formed on the second electrode material 930. In the illustrated embodiment the first and second electrode materials 910, 930 comprise TiN and the dielectric element material 920 and the sacrificial material 940 comprise SiN.

Figure 10:
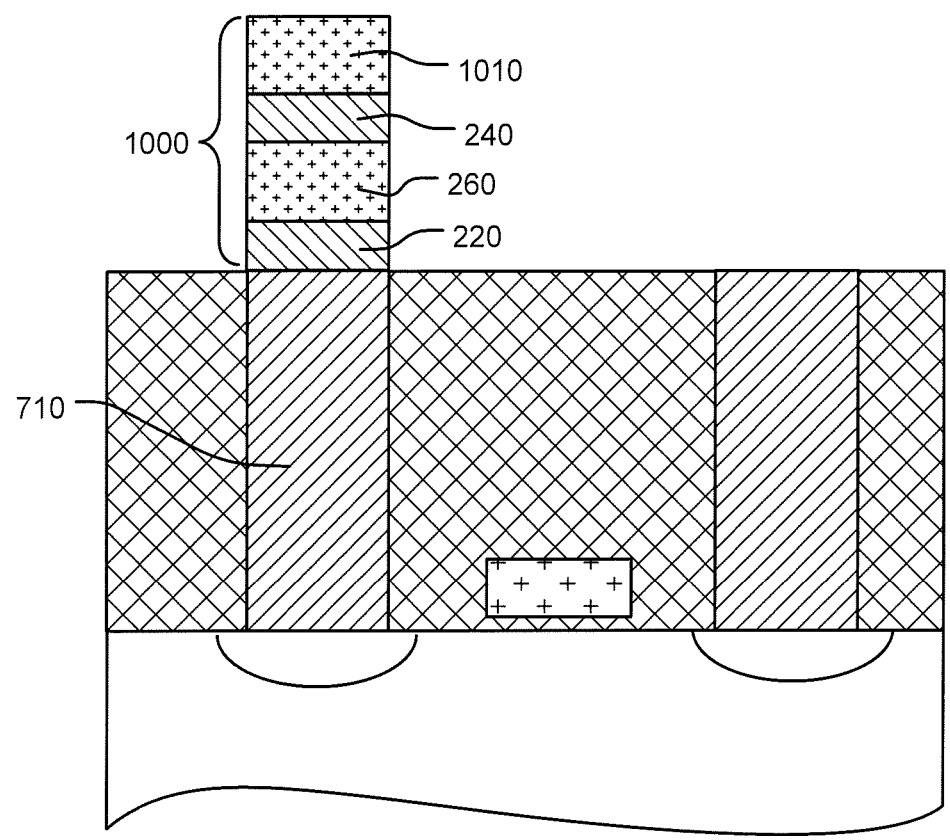

Next, the structure 1000 of FIG. 9 is etched to form a stack 1000 on the plug 810, resulting in the structure illustrated in FIG. 10. The stack 1000 comprises a first electrode 220 on the plug 710, a dielectric element 260 on the first electrode 220, a second electrode 240 on the dielectric element 260, and a sacrificial element 1010 on the second element 240.

Figure 11:
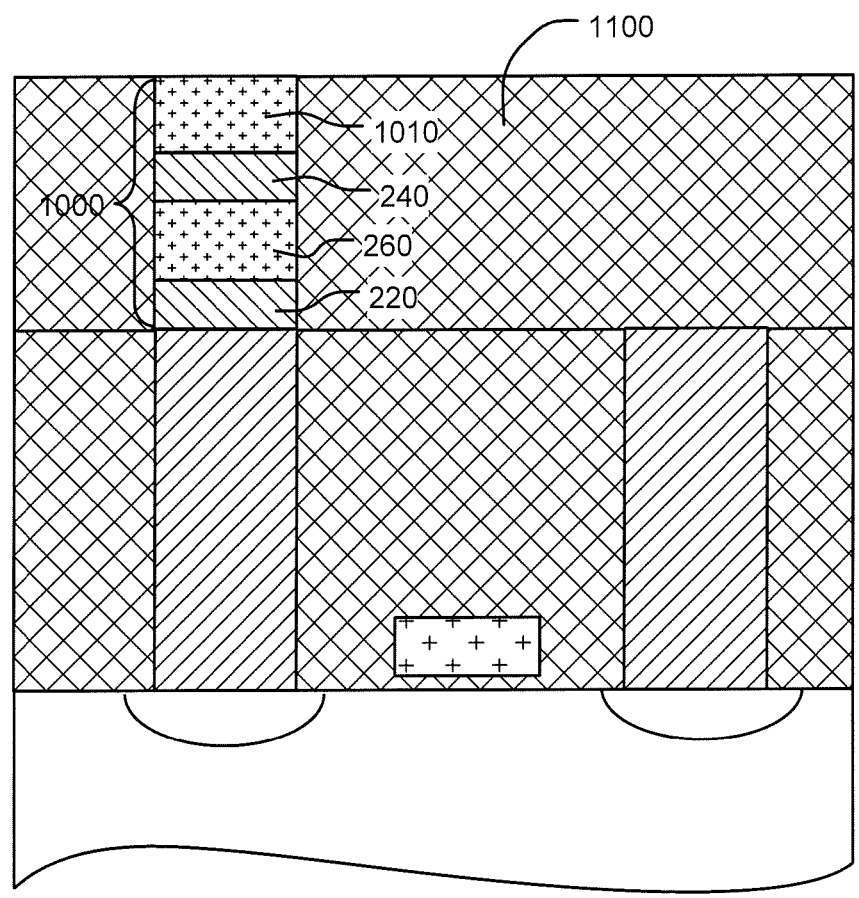

Next, a dielectric fill 1100 is formed on the structure illustrated in FIG. 10 and a planarized, resulting in the structure illustrated in FIG. 11. The dielectric fill 1100 is formed in one embodiment by high-density plasma chemical vapor deposition (HDP CVD), followed by chemical-mechanical polishing (CMP) to expose a top surface of the sacrificial element 1010.

Figure 12:
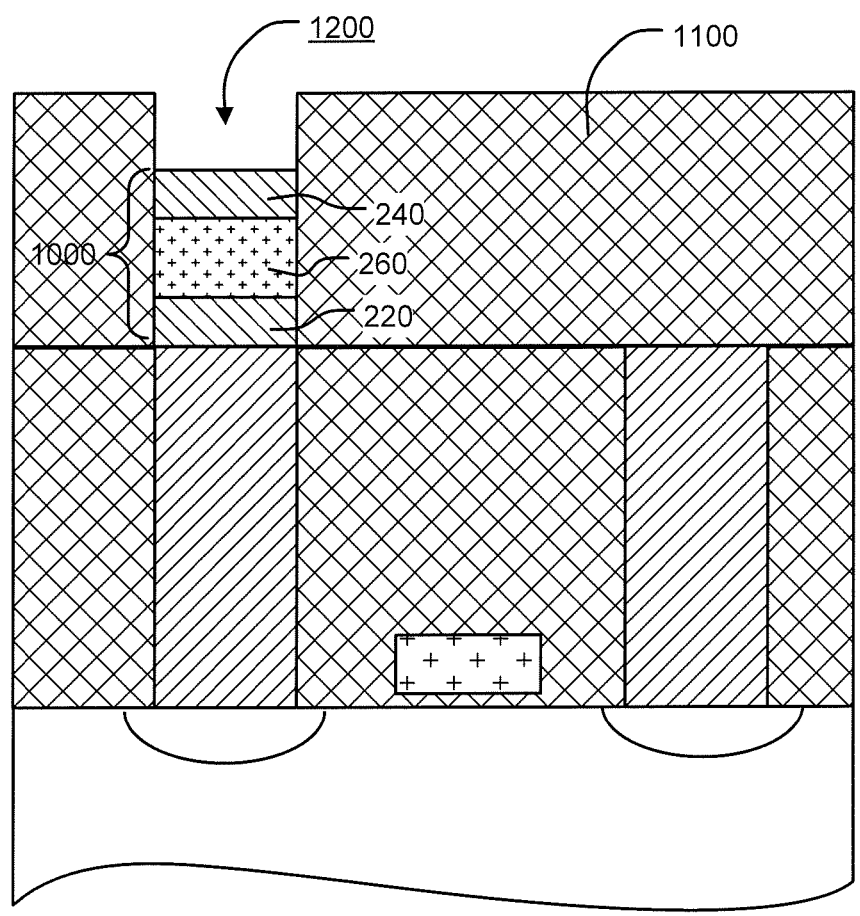

Next, the sacrificial element 1010 is removed to form opening 1200, resulting in the structure illustrated in FIG. 12.

Figure 13:
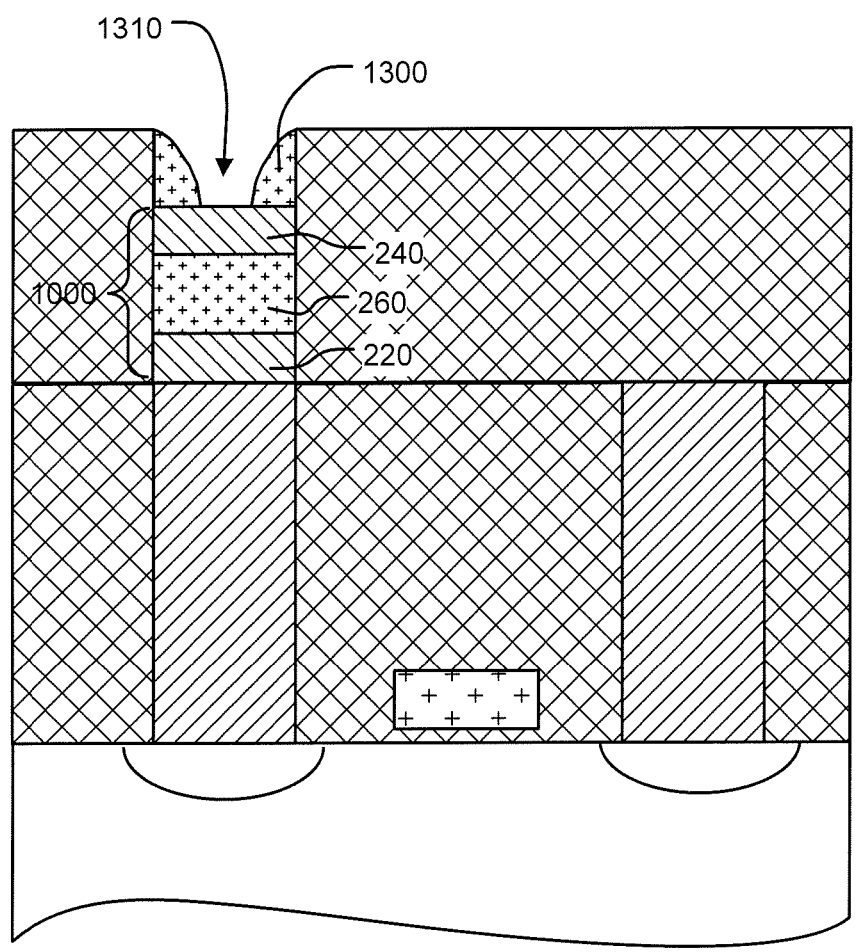

Next, a sidewall spacer 1300 is formed within the opening 1200 of FIG. 12, resulting in the structure illustrated in FIG. 13. The sidewall spacer 1300 defines an opening 1310 exposing a portion of the top surface of the second electrode 240, and in the illustrated embodiment the sidewall spacer 1300 comprises SiN or Si.

The sidewall spacer 1300 may be formed by forming a conformal sidewall spacer material layer on the structure illustrated in FIG. 12, and anisotropically etching the sidewall spacer material layer. In such an embodiment the opening 1310 is self-centered within the sidewall spacer 1300.

Figure 14:
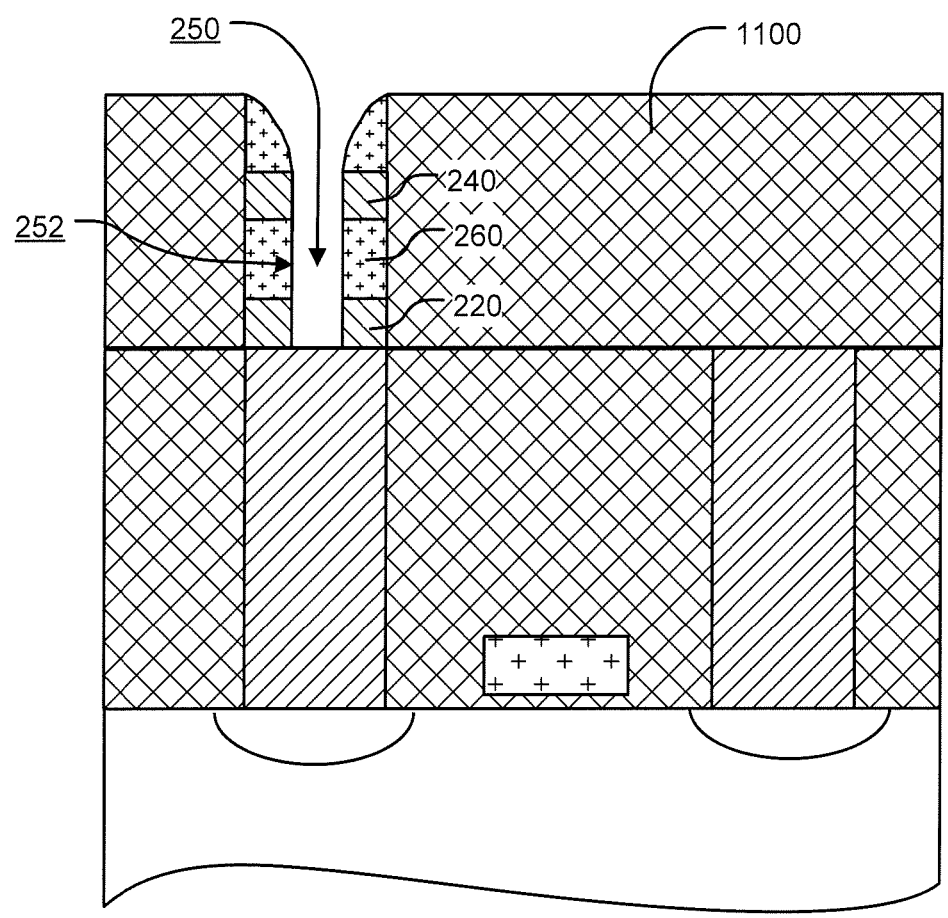

Next, the second electrode 240, dielectric element 260, and first electrode 220 are etched using the sidewall spacer 1300 as an etch mask to form via 250 having sidewall surface 252, resulting in the structure illustrated in FIG. 14. The sidewall surface 252 of the via 250 has a circular cross-section in the illustrated embodiment. However, in embodiments the via 250 may have a cross-section that is square, elliptical, rectangular, or somewhat irregularly shaped, depending on the manufacturing technique applied to form the via 250.

Figure 15:
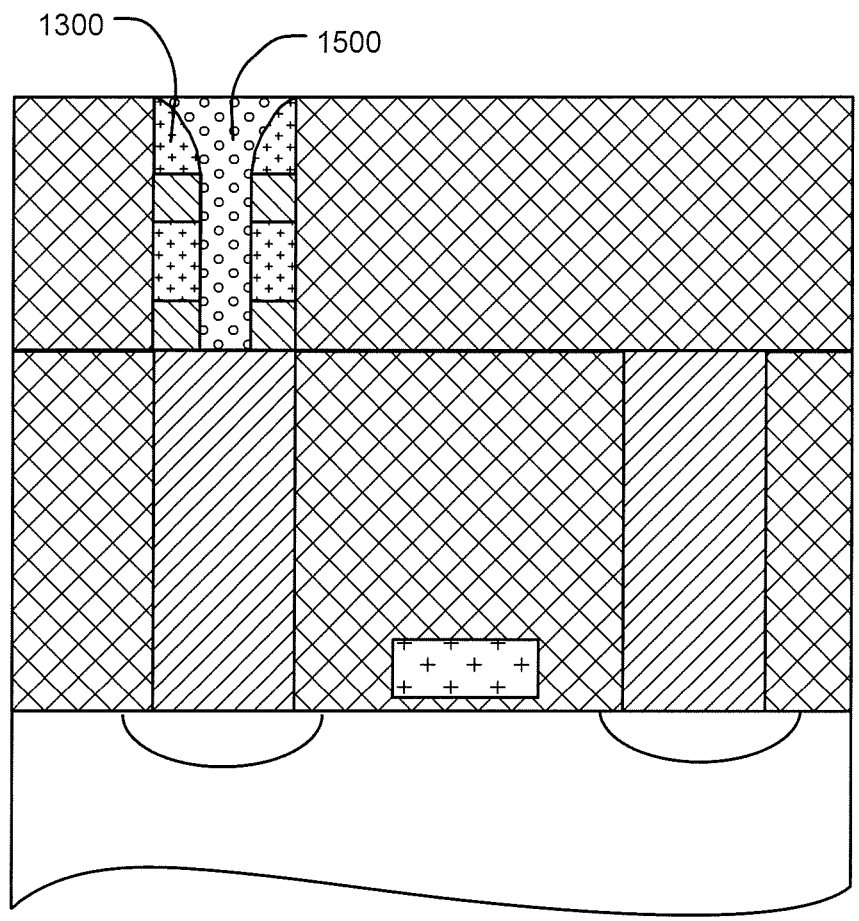

Next, memory material 1500 is formed within the via 250 of FIG. 14, resulting in the structure illustrated in FIG. 15.

Figure 16:
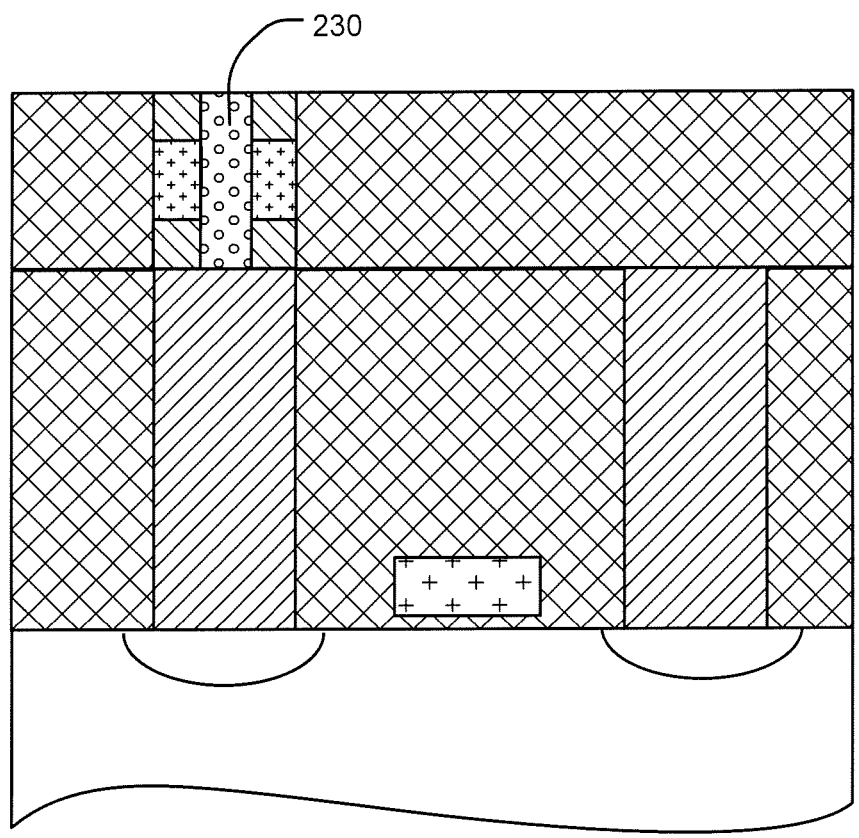

Next, a planarizing process such as CMP is performed on the structure illustrated in FIG. 15 to remove the sidewall spacer 1300 and form memory element 230, resulting in the structure illustrated in FIG. 16.

Figure 17:
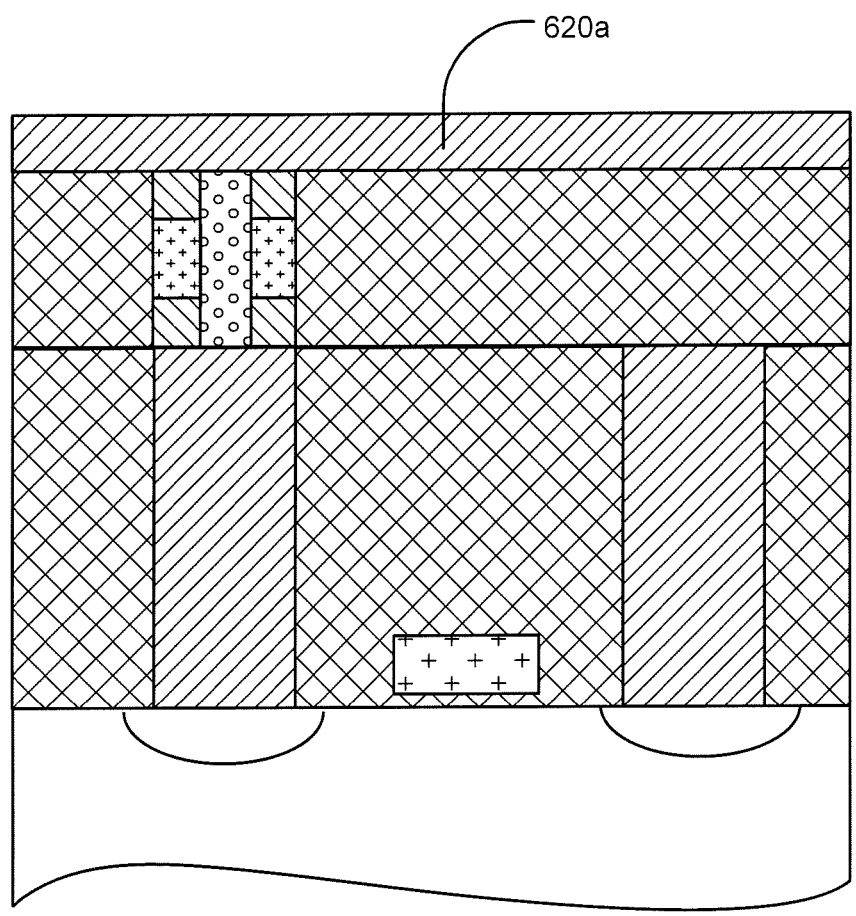

Next, bit line material is patterned on the structure illustrated in FIG. 16 to form bit line 620a, resulting in the structure illustrated in FIG. 17.

Figure 18:
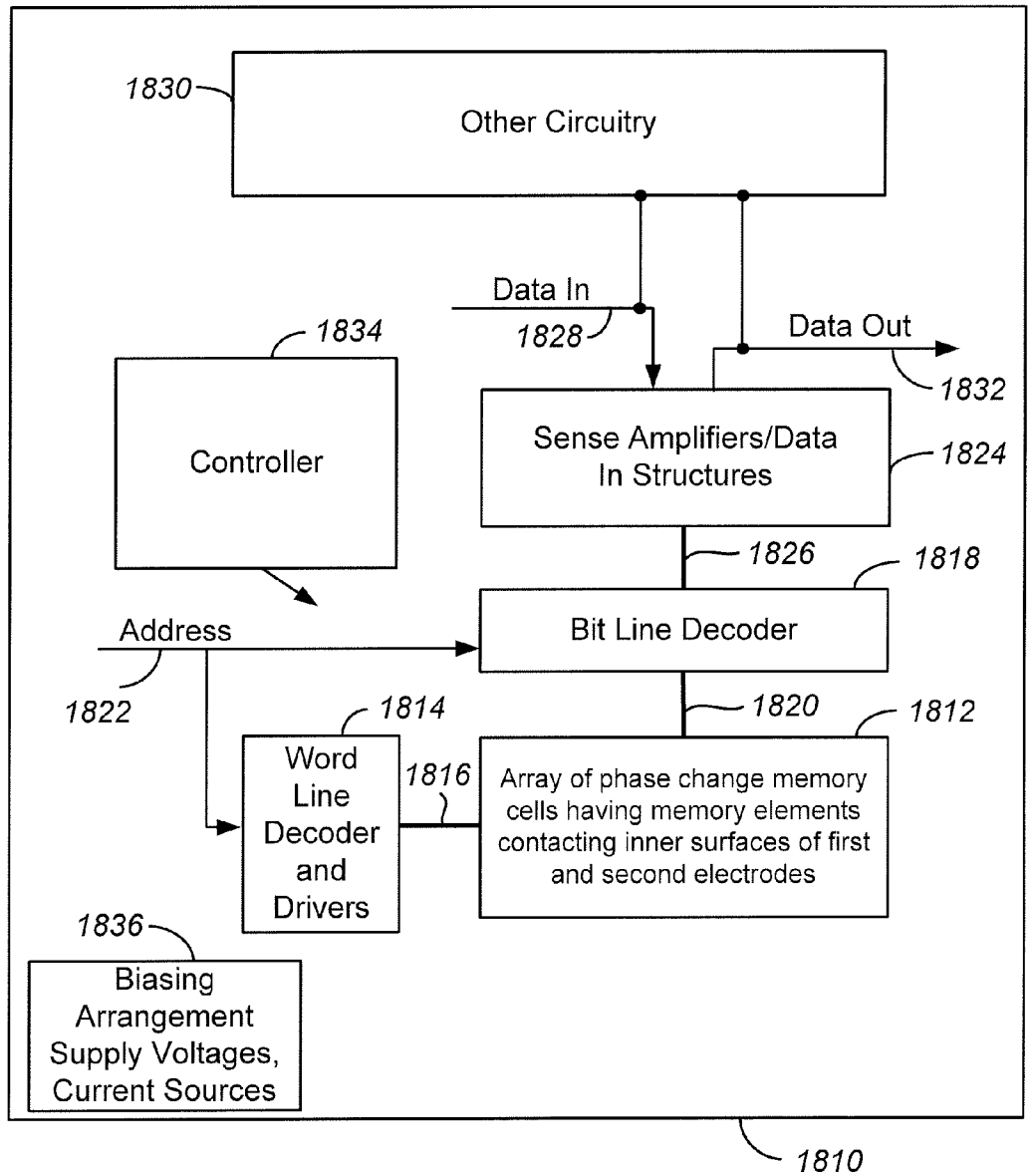
FIG. 18 is a simplified block diagram of an integrated circuit including a memory array implemented using memory cells having memory elements contacting inner surfaces of first and second electrodes as described herein.

FIG. 18 is a simplified block diagram of an integrated circuit 1810 including a memory array 1812 implemented using memory cells having memory elements contacting inner surfaces of first and second electrodes. A word line decoder 1814 having read, set and reset modes is coupled to and in electrical communication with a plurality of word lines 1816 arranged along rows in the memory array 1812. A bit line (column) decoder 1818 is in electrical communication with a plurality of bit lines 1820 arranged along columns in the array 1812 for reading, setting, and resetting the phase change memory cells (not shown) in array 1812. Addresses are supplied on bus 1822 to word line decoder and drivers 1814 and bit line decoder 1818. Sense amplifiers and data-in structures in block 1824, including voltage and/or current sources for the read, set, and reset modes are coupled to bit line decoder 1818 via data bus 1826. Data is supplied via a data-in line 1828 from input/output ports on integrated circuit 1810, or from other data sources internal or external to integrated circuit 1810, to data-in structures in block 1824. Other circuitry 1830 may be included on integrated circuit 1810, such as a general purpose processor or special purpose application circuitry, or a combination of modules providing system-on-a-chip functionality supported by array 1812. Data is supplied via a data-out line 1832 from the sense amplifiers in block 1824 to input/output ports on integrated circuit 1810, or to other data destinations internal or external to integrated circuit 1810.

A controller 1834 implemented in this example, using a bias arrangement state machine, controls the application of bias arrangement supply voltages and current sources 1836, such as read, program, erase, erase verify and program verify voltages and/or currents. Controller 1834 may be implemented using special-purpose logic circuitry as known in the art. In alternative embodiments, controller 1834 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1834.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device comprising:
a memory element having a cylindrical side surface;
a first electrode having ring-shaped inner surface surrounding the memory element in contact the memory element at a first contact area on the cylindrical side surface; and
a second electrode spaced away from the first electrode, the second electrode having a ring-shaped inner surface surrounding the memory element to contact the memory element at a second contact area on the cylindrical side surface.

2. The memory device of claim 1, wherein the memory element comprises a pillar of memory material.

3. The memory device of claim 1, the memory element has an inner surface, and further comprising a fill material within an interior defined by the inner surface of the memory element.

4. The memory device of claim 1, wherein the second electrode comprises a portion of a bit line.

5. The memory device of claim 1, further comprising a dielectric element between the first and second electrodes and having an inner surface surrounding the memory element to contact the memory element at a third contact area on the cylindrical side surface, wherein the inner surfaces of the dielectric element and the first and second electrodes are aligned.

6. The memory device of claim 1, further comprising a first conductive element and a second conductive element, wherein:
- the memory element and first electrode have respective bottom surfaces contacting the first conductive element; and
- the memory element and the second electrode have respective top surfaces contacting the second conductive element.

7. The memory device of claim 6, wherein the second conductive element comprises a portion of a bit line.

8. The memory device of claim 6, wherein the first conductive element is electrically coupled to a terminal of an access device.

9. A method for manufacturing a memory device, the method comprising:
- forming a first electrode having a ring-shaped inner surface;
- forming a second electrode spaced away from the first electrode and having a ring-shaped inner surface; and
- forming a memory element having a cylindrical side surface, the inner surface of the first electrode contacting the memory element at a first contact area on the cylindrical side surface, the inner surface of the second electrode contacting the memory element at a second contact area on the cylindrical side surface.

10. The method of claim 9, wherein the memory element comprises a pillar of memory material.

11. The method of claim 9, wherein the memory element has an inner surface, and further comprising a fill material within an interior defined by the inner surface of the memory element.

12. The method of claim 9, wherein the second electrode comprises a portion of a bit line.

13. The method of claim 9, further comprising forming a dielectric element between the first and second electrodes and having an inner surface contacting the memory element at a third contact area on the cylindrical side surface, wherein the inner surfaces of the dielectric element and the first and second electrodes are aligned.

14. The method of claim 9, further comprising forming a first conductive element and a second conductive element, wherein:
- the memory element and first electrode have respective bottom surfaces contacting the first conductive element; and
- the memory element and the second electrode have respective top surfaces contacting the second conductive element.

15. The method of claim 14, wherein the second conductive element comprises a portion of a bit line.

16. A method for manufacturing a memory device, the method comprising:
- forming a structure on a top surface of a first conductive element, the structure comprising a first layer of electrode material on the first conductive element, a layer of dielectric material on the first layer of electrode material, and a second layer of electrode material on the layer of dielectric material;
- forming a via through the structure which results in ring-shaped inner surfaces on the first layer of electrode material, the layer of dielectric material and the second layer of electrode material; and
- forming a memory element within the via, the memory element having an outside surface in contact with the ring-shaped inner surfaces of the first layer of electrode material and the second layer of electrode material.

17. The method of claim 16, wherein the forming the structure comprises:
- forming first electrode material on the top surface of the first conductive element, forming dielectric element material on the first electrode material, and forming second electrode material on the dielectric element material; and
- etching down through the first electrode material, thereby forming a stack including the first layer of electrode material, the layer of dielectric material and the second layer of electrode material.

18. The method of claim 17, wherein the forming the stack further comprises forming sacrificial material on the second electrode material prior to the step of etching through the first electrode material.

19. The method of claim 18, wherein the forming a via step comprises:
- forming dielectric fill material on the stack and performing a planarizing process to expose a top surface of the sacrificial material;
- removing the sacrificial material to form an opening;
- forming a sidewall spacer within the opening; and
- etching through the stack using the sidewall spacer as an etch mask to form the via.

20. The method of claim 19, wherein the forming a sidewall spacer step comprises:
- forming dielectric sidewall spacer material within the opening; and
- anisotropically etching the dielectric sidewall spacer material.

21. The method of claim 16, wherein the forming the memory element within the via comprises:
- depositing a layer of memory material on bottom and side surfaces of the via to define an interior within the via; and
- filling the interior within the via with fill material different than the memory material.

* * * * *